US012749911B2

(12) United States Patent
Feng et al.

(10) Patent No.: US 12,749,911 B2
(45) Date of Patent: Sep. 29, 2026

(54) BATTERY CHARGING METHOD AND SYSTEM BASED ON LITHIUM PLATING DETECTION, AND AUTOMOBILE AND MEDIUM

(71) Applicant: BYD COMPANY LIMITED, Shenzhen (CN)

(72) Inventors: Tianyu Feng, Shenzhen (CN); Shiwei Shu, Shenzhen (CN); Linwang Deng, Shenzhen (CN); Xiaoqian Li, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 801 days.

(21) Appl. No.: 18/189,474

(22) Filed: Mar. 24, 2023

(65) Prior Publication Data

US 2023/0231403 A1 Jul. 20, 2023

Related U.S. Application Data

(63) Continuation of application No. PCT/CN2021/120362, filed on Sep. 24, 2021.

(30) Foreign Application Priority Data

Sep. 27, 2020 (CN) ........................ 202011032994.7

(51) Int. Cl.
*H02J 7/04* (2006.01)
*G01R 31/3835* (2019.01)
(Continued)

(52) U.S. Cl.
CPC ............ *H02J 7/94* (2026.01); *G01R 31/3835* (2019.01); *G01R 31/389* (2019.01); *H01M 10/44* (2013.01);
(Continued)

(58) Field of Classification Search
None
See application file for complete search history.

(56) References Cited

U.S. PATENT DOCUMENTS 10,164,456 B2 12/2018 Luo et al.
10,829,004 B1 * 11/2020 Han ...................... H01M 10/44
(Continued)

FOREIGN PATENT DOCUMENTS

CN 105576306 A 5/2016
CN 106099230 A 11/2016
(Continued)

OTHER PUBLICATIONS

The World Intellectual Property Organization (WIPO) International Search Report for PCT/CN2021/120362 Dec. 14, 2021 6 Pages.

*Primary Examiner* — Arun C Williams
(74) *Attorney, Agent, or Firm* — Wenye Tan

(57) ABSTRACT

A battery charging method based on lithium plating detection includes: acquiring a battery charging strategy table after receiving a battery charging instruction; charging a battery according to a charging current in the battery charging strategy table, and performing at least one charging lithium plating detection on the battery during the charging of the battery, to obtain a first lithium plating detection result; continuing the charging of the battery according to the charging current and the charging lithium plating detection of the battery when no lithium plating phenomenon occurs, and stopping the charging lithium plating detection when the lithium plating phenomenon occurs or the charging of the battery is completed; and updating the charging current according to a preset first current reduction strategy when the lithium plating phenomenon occurs, and continuing the charging of the battery according to the updated charging current until the charging is completed.

15 Claims, 3 Drawing Sheets

(51) Int. Cl.

| | |
|---|---|
| ***G01R 31/389*** | (2019.01) |
| ***H01M 10/44*** | (2006.01) |
| ***H01M 10/48*** | (2006.01) |
| ***H02J 7/80*** | (2026.01) |
| ***H02J 7/94*** | (2026.01) |
| *B60R 16/033* | (2006.01) |

(52) U.S. Cl.

CPC ............... *H01M 10/48* (2013.01); *H02J 7/80* (2026.01); *B60R 16/033* (2013.01); *H01M 2220/20* (2013.01)

(56) References Cited

U.S. PATENT DOCUMENTS

| | | | | |
|---|---|---|---|---|
| 2016/0111898 | A1 | 4/2016 | Luo et al. | |
| 2020/0212684 | A1 | 7/2020 | Campbell et al. | |
| 2020/0412153 | A1* | 12/2020 | Matsumura ........... | H02J 7/0031 |

FOREIGN PATENT DOCUMENTS

| | | | |
|---|---|---|---|
| CN | 108519558 | A | 9/2018 |
| CN | 106099230 | B | 2/2019 |
| CN | 109358290 | A | 2/2019 |
| CN | 208461527 | U | 2/2019 |
| CN | 109613436 | A | 4/2019 |
| CN | 109671994 | A | 4/2019 |
| CN | 109888419 | A | 6/2019 |
| CN | 110058170 | A | 7/2019 |
| CN | 110837057 | A | 2/2020 |
| CN | 111077456 | A | 4/2020 |
| CN | 111082171 | A | 4/2020 |
| CN | 111198328 | A | 5/2020 |
| CN | 110350259 | B | 2/2021 |
| CN | 109613436 | B | 6/2021 |
| CN | 110109029 | B | 5/2022 |
| JP | 2012016263 | A | 1/2012 |
| JP | 2012049040 | A | 3/2012 |
| JP | 2018520622 | A | 7/2018 |
| JP | 2018528573 | A | 9/2018 |
| WO | 2016147572 | A1 | 9/2016 |

* cited by examiner

BATTERY CHARGING METHOD AND SYSTEM BASED ON LITHIUM PLATING DETECTION, AND AUTOMOBILE AND MEDIUM

CROSS-REFERENCE TO RELATED APPLICATIONS

The present application is a continuation application of PCT application No. PCT/CN2021/120362 filed on Sep. 24, 2021, which claims priority to Chinese Patent Application No. 202011032994.7, filed on Sep. 27, 2020, and entitled BATTERY CHARGING METHOD AND SYSTEM BASED ON LITHIUM PLATING DETECTION, AND AUTOMOBILE AND MEDIUM", the entire content of all of which is incorporated herein by reference.

FIELD

The present disclosure relates to the technical field of battery charging, and more specifically, to a battery charging method and system based on lithium plating detection, a vehicle, and a medium.

BACKGROUND

With the development of science and technology, new energy vehicles are developing increasingly more rapidly. A battery is an important part of the new energy vehicle, and therefore users have imposed increasingly high requirements for a charging time of the vehicle battery. In this way, the battery charging time is further shortened, which can effectively improve vehicle use experience of the user.

In the related art, the battery is fast charged mainly through a control method for charging waveform optimization and a control method for model combination. The control method for optimizing a charging waveform includes optimizing a constant-current and constant-voltage charging method, a step charging method, a pulse charging method, an alternating current charging method, and the like. However, the method is an off-line method targeted at a fresh-from-the-factory battery without fully considering an actual change of the battery during actual use, resulting in low safety of the battery. The control method of the combination model includes methods such as combining an equivalent circuit model, combining a thermal model, combining an electrochemical model, combining a combined model of the forgoing models, and the like. Fast charging of the battery is implemented by using the forgoing models, but the method has the following shortcomings. An aging gap between batteries during use is relatively large, it is not difficult to accurately use a unified model for fast charging of the battery, and the model method has high costs.

SUMMARY

Embodiments of the present disclosure provide a battery charging method and system based on lithium plating detection, a vehicle, and a medium, to improve charging safety while implementing fast charging of a battery.

According to a first aspect, the present disclosure provides a battery charging method based on lithium plating detection, including: acquiring a battery charging strategy table after receiving a battery charging instruction; charging a battery according to a charging current in the battery charging strategy table, and performing at least one charging lithium plating detection on the battery during the charging of the battery, to obtain a first lithium plating detection result; continuing the charging of the battery according to the charging current and the charging lithium plating detection of the battery during the charging of the battery when the first lithium plating detection result is that no lithium plating phenomenon occurs, and stopping the charging lithium plating detection of the battery when the first lithium plating detection result is that the lithium plating phenomenon occurs or the charging of the battery is completed; and updating the charging current in the battery charging strategy table according to a preset first current reduction strategy when the first lithium plating detection result is that the lithium plating phenomenon occurs, and continuing the charging of the battery according to the updated charging current until the charging of the battery is completed.

According to a second aspect, the present disclosure provides a battery charging system based on lithium plating detection. The system includes: a charging strategy table acquisition module, configured to acquire a battery charging strategy table after receiving a battery charging instruction; a charging lithium plating detection module, configured to charge a battery according to a charging current in the battery charging strategy table, and perform at least one charging lithium plating detection on the battery during the charging of the battery, to obtain a first lithium plating detection result; a first charging module, configured to: continue the charging of the battery according to the charging current and the charging lithium plating detection of the battery during the charging of the battery when the first lithium plating detection result is that no lithium plating phenomenon occurs, and stop the charging lithium plating detection of the battery when the first lithium plating detection result is that the lithium plating phenomenon occurs or the charging of the battery is completed; and a second charging module, configured to update the charging current in the battery charging strategy table according to a preset first current reduction strategy when the first lithium plating detection result is that the lithium plating phenomenon occurs, and continue the charging of the battery according to the updated charging current until the charging of the battery is completed According to a third aspect, the present disclosure provides a vehicle, including the battery charging system based on lithium plating detection.

According to a fourth aspect, the present disclosure provides a non-transitory computer-readable storage medium storing computer-executable instructions for, when executed by one or more processors, performing a battery charging method based on lithium plating detection. The method includes: acquiring a battery charging strategy table after receiving a battery charging instruction; charging a battery according to a charging current in the battery charging strategy table, and performing at least one charging lithium plating detection on the battery during the charging of the battery, to obtain a first lithium plating detection result; continuing the charging of the battery according to the charging current and the charging lithium plating detection of the battery during the charging of the battery when the first lithium plating detection result is that no lithium plating phenomenon occurs, and stopping the charging lithium plating detection of the battery when the first lithium plating detection result is that the lithium plating phenomenon occurs or the charging of the battery is completed; and updating the charging current in the battery charging strategy table according to a preset first current reduction strategy when the first lithium plating detection result is that the lithium plating phenomenon occurs, and continuing the charging of the battery according to the updated charging current until the charging of the battery is completed.

According to the battery charging method and system based on lithium plating detection and the vehicle, the method includes: acquiring a battery charging strategy table after receiving a battery charging instruction; charging a battery according to a charging current in the battery charging strategy table, and performing at least one charging lithium plating detection on the battery during the charging of the battery, to obtain a first lithium plating detection result; continuing the charging of the battery according to the charging current and the charging lithium plating detection of the battery during the charging of the battery when the first lithium plating detection result is that no lithium plating phenomenon occurs, and stopping the charging lithium plating detection of the battery when the first lithium plating detection result is that the lithium plating phenomenon occurs or the charging of the battery is completed; and updating the charging current in the battery charging strategy table according to a preset first current reduction strategy when the first lithium plating detection result is that the lithium plating phenomenon occurs, and continuing the charging of the battery according to the updated charging current until the charging of the battery is completed.

According to the present disclosure, it is detected whether the lithium plating phenomenon occurs during the charging of the battery, and a present charging current of the battery is reduced according to the preset first current reduction strategy when the lithium plating phenomenon occurs to the battery. In this way, the characteristic of fast charging of the battery is further fully ensured while improving the safety of the battery in the charging process. In addition, the method in this embodiment may be applied to different types of batteries. It is only necessary to adjust the charging current in the battery charging strategy table of different types of batteries according to the first lithium plating detection result. Moreover, the method relates to a relatively small calculated amount, which reduces the computation complexity of the system, thereby improving the operating speed of the system.

BRIEF DESCRIPTION OF THE DRAWINGS

In order to more clearly describe technical solutions in the embodiments of the present disclosure, the accompanying drawings are briefly described below. Apparently, the accompanying drawings in the following description merely show some of the embodiments of the present disclosure, and a person of ordinary skill in the art may still derive other accompanying drawings from these accompanying drawings without any creative effort.

DETAILED DESCRIPTION

The technical solutions in the embodiments of the present disclosure are to be described with reference to the accompanying drawings. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

Figure 1:
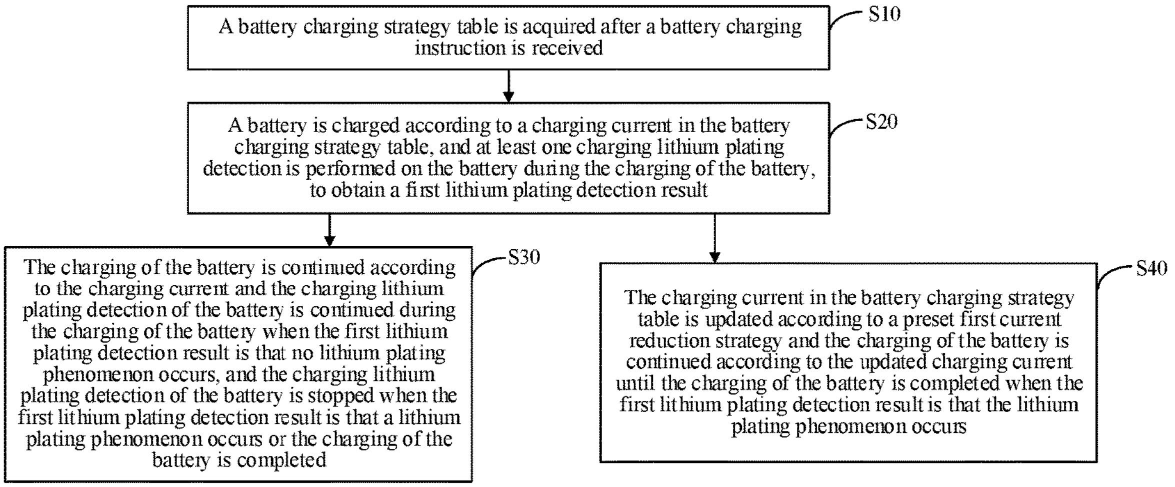
FIG. 1 is a flowchart of a battery charging method based on lithium plating detection according to an embodiment of the present disclosure.

In an embodiment, as shown in FIG. 1, a battery charging method based on lithium plating detection is provided, including the following steps.

S10: A battery charging strategy table is acquired after a battery charging instruction is received.

The battery charging instruction is used for indicating that charging a power battery pack should be started at this time. For example, a user finds that a current state of charge (SOC) of the power battery pack is excessively low, and a vehicle is charged by using a charging pile at this time. At a moment of starting charging, the battery charging instruction is generated. The battery charging strategy table includes data related to battery charging, for example, a charging current, a charging voltage, and the like. The battery charging strategy table is obtained based on a fast charging strategy formulated by a factory when a battery leaves the factory. It may be understood that the charging current in the battery charging strategy table may be updated and adjusted depending on whether a lithium plating phenomenon occurs to the battery during charging and/or upon completion of charging of the battery. The lithium plating phenomenon is a phenomenon that lithium metal is deposited on a negative electrode of the battery.

S20: A battery is charged according to a charging current in the battery charging strategy table, and at least one charging lithium plating detection is performed on the battery during the charging of the battery, to obtain a first lithium plating detection result.

The charging lithium plating detection means a process of performing lithium plating phenomenon detection on the battery during the charging of the battery. The charging lithium plating detection includes but is not limited to the following methods: a three-electrode direct measurement method, a coulombic efficiency measurement method, and an electrochemical impedance measurement method. The first lithium plating detection result is obtained after the charging lithium plating detection is performed on the battery during the charging of the battery. The first lithium plating detection result includes two results: a lithium plating phenomenon occurs to the battery, and no lithium plating phenomenon occurs to the battery.

Specifically, the battery charging strategy table is acquired after the battery charging instruction is received, the battery is charged according to the charging current in the battery charging strategy table, and at least one charging lithium plating detection is performed on the battery during the charging of the battery, to obtain the first lithium plating detection result, so as to determine whether the lithium plating phenomenon occurs during the charging of the battery. If the lithium plating phenomenon occurs to the battery in the charging process, the charging current of the battery in the current charging process should be reduced, so as to inhibit lithium plating, and then reduce a lithium plating representation amount in the subsequent charging process. If no lithium plating phenomenon occurs to the battery in the charging process, the charging of the battery is continued by using the charging current in the current charging process, and the charging lithium plating detection of the battery is continued in the subsequent charging process until the charging of the battery is completed.

S30: When the first lithium plating detection result is that no lithium plating phenomenon occurs, the charging of the battery is continued according to the charging current, and the charging lithium plating detection of the battery is continued during the charging of the battery, and the charging lithium plating detection of the battery is stopped when the first lithium plating detection result is that a lithium plating phenomenon occurs or the charging of the battery is completed.

Specifically, after the battery is charged according to the charging current in the battery charging strategy table, and the charging lithium plating detection is performed on the battery during the charging of the battery, to obtain the first lithium plating detection result, the charging of the battery is continued according to the charging current in the battery charging strategy table and the charging lithium plating detection of the battery is continued during the charging of the battery when the first lithium plating detection result is that no lithium plating phenomenon occurs. When the first lithium plating detection result obtained at any subsequent moment is that the lithium plating phenomenon occurs, the charging lithium plating detection on the battery is stopped, the charging current in the battery charging strategy table is updated according to the preset first current reduction strategy, and the charging of the battery is continued according to the updated charging current until the charging of the battery is completed. When the first detection results obtained by subsequently performing charging lithium plating detection on the battery are that no lithium plating phenomenon occurs, it indicates that there is no need to update the charging current in the battery charging strategy table, and after the charging of the battery is completed, the charging lithium plating detection on the battery is stopped.

S40: When the first lithium plating detection result is that the lithium plating phenomenon occurs, the charging current in the battery charging strategy table is updated according to a preset first current reduction strategy, and the charging of the battery is continued according to the updated charging current until the charging of the battery is completed.

The preset first current reduction strategy means a strategy in which the present charging current is reduced by a preset proportion. For example, the first current reduction strategy may be reducing the charging current of the battery in the current charging process by the preset proportion. The preset proportion may be 0.1%-1% of the present charging current. For example, the preset proportion is 0.5% of the present charging current. In this way, when the charging current is 1 A, the charging current may be lowered by 0.5%. That is to say, the charging current is reduced to 0.995 A. It may be understood that it may be determined according to different situations whether the charging of the battery is completed. For example, it may be determined that the charging of the battery is completed after a present SOC value of the battery is set to reach a preset SOC value. In another scenario, the battery may also be powered off in advance. For example, if a sudden power outage prevents the battery from continuing being charged or the charging is ended in advance through manual operations (such as unplugging a charging plug from a charging pile), it may be considered that the battery is also charged at this time.

Specifically, after the battery is charged according to the charging current in the battery charging strategy table, and the charging lithium plating detection is performed on the battery during the charging of the battery to obtain the first lithium plating detection result, the charging current of the battery in the current charging process is reduced according to the preset first current reduction strategy when the first lithium plating detection result is that the lithium plating phenomenon occurs (since a lithium potential of the negative electrode of the battery is reduced to below 0 V when the lithium plating phenomenon occurs to the battery, a polarization phenomenon in the charging process more easily reduces the lithium potential of the negative electrode of the battery to a smaller value if the battery is still charged by using the present charging current, and therefore the present charging current of the battery needs to be reduced), and the reduced charging current is updated to the battery charging strategy table. The charging of the battery is continued according to the updated charging current in the battery charging strategy table (that is, the above reduced charging current), to reduce a probability that an increase in the lithium plating representation amount occurs to the battery in the subsequent charging process until the charging of the battery is completed, thereby ensuring safety of the battery in the charging process. That is to say, it indicates that if a lithium plating phenomenon occurring to the battery is detected in the charging process, there is no need to continue performing the charging lithium plating detection on the battery.

In this embodiment, it is detected whether the lithium plating phenomenon occurs to the battery during the charging of the battery, and when the lithium plating phenomenon occurs to the battery, the present charging current of the battery is reduced according to the preset first current reduction strategy. Therefore, it is ensured that the characteristic of fast charging of the battery is realized under the premise of safety while improving the safety of the battery in the charging process. In addition, the method in this embodiment may be applied to different types of batteries. It is only necessary to adjust the charging current in the battery charging strategy table of different types of batteries according to the first lithium plating detection result. Moreover, the method relates to a relatively small calculated amount, which reduces the computation complexity of the system, thereby improving the operating speed of the system.

Figure 2:
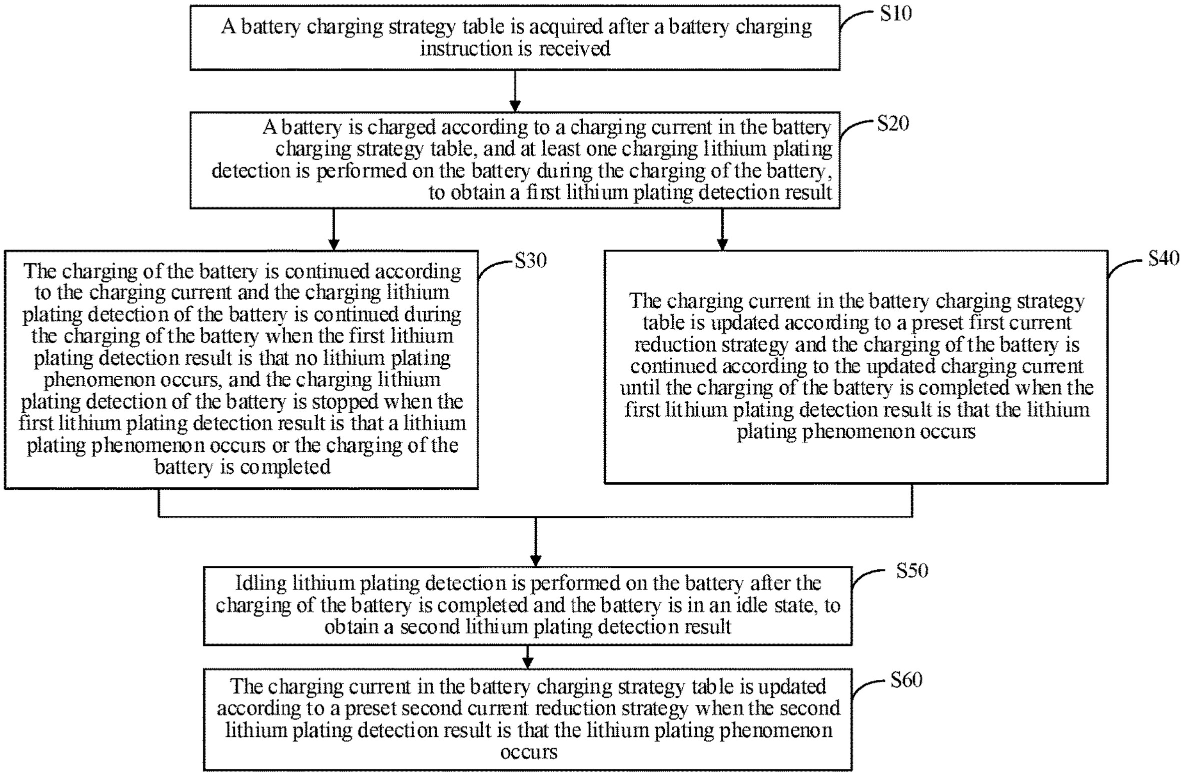
FIG. 2 is another flowchart of a battery charging method based on lithium plating detection according to an embodiment of the present disclosure.

In an embodiment, after step S30 or S40, as shown in FIG. 2, after the charging of the battery is completed, the following steps are included.

S50: Lithium plating detection is performed on the battery after the charging of the battery is completed and the battery is in an static state, to obtain a second lithium plating detection result.

The static state means a state in which no operation (such as discharging and charging) is performed on the battery. The lithium plating detection indicates a method for performing lithium plating detection on the battery after the charging of the battery is completed. The lithium plating detection includes but is not limited to the following methods: a voltage static method, a nonlinear frequency response method, a voltage relaxation method, and the like. The second lithium plating detection result is obtained after the lithium plating detection is performed on the battery after the charging of the battery is completed. The second lithium plating detection result includes two results: the lithium plating phenomenon occurs to the battery, and no lithium plating phenomenon occurs to the battery. In addition, when the second lithium plating detection result is that the lithium plating phenomenon occurs to the battery, the second lithium plating detection result may further represent the lithium plating representation amount of the battery.

Specifically, the charging of the battery is continued according to the updated charging current, and the charging lithium plating detection of the battery is continued during the charging of the battery until the charging of the battery is completed. The charged battery is caused to be in the static state, so as to perform lithium plating detection on the battery, to obtain the second lithium plating detection result.

In a specific embodiment, step S50 of performing lithium plating detection on the battery after the charging of the battery is completed and the battery is in the static state, to obtain the second lithium plating detection result includes the following steps:

regularly collecting a voltage of the battery at a preset time interval and associatively storing the collected voltage and a collection time of the voltage as voltage data after the charging of the battery is completed and the battery is in the static state.

The battery in the step is the battery that waits for lithium plating detection after being charged. The occurrence of lithium plating during the charging of the battery means that a part of lithium metal is deposited on the negative electrode of the battery during charging of the battery. The preset time interval may be determined according to an actual detection requirement (such as the detected battery type). For example, the preset time interval may be every 5 s, every 10 s, or the like. The collection time is a corresponding time point at which the voltage of the battery is collected according to the preset time interval. The voltage data includes each set of voltages and the collection times corresponding to the voltages.

A time-differential voltage curve is constructed in a voltage-time coordinate system according to the voltage data.

The time-differential voltage curve represents a curve of variation of a first derivative relationship of the battery with the voltage. The first derivative relationship is calculated according to the collection time and the voltages. The voltage-time coordinate system is the coordinate system shown in FIG. 3. The horizontal axis of the coordinate system represents the collected voltage of the battery, and the vertical axis represents the time corresponding to the collected voltage of the battery. L1 represents the time-differential voltage curve, and L2 represents the curve of the variation of the collected voltages of the battery with the collection times. Specifically, after the voltage of the battery is regularly collected at a preset time interval, and the collected voltage and the collection time of the voltage are associatively stored as voltage data, the time-differential voltage curve is determined after the first derivative relationship corresponding to the voltage data is obtained by using the time-differential voltage according to the voltage data.

Optionally, in the step, the determining the time-differential voltage curve according to the voltage data includes: generating the time-differential voltage curve according to the voltage data and a preset first derivative relationship. The preset first derivative relationship is calculated according to the voltage of each set of collected batteries and the collection time, and the preset first derivative relationship is dt/dU.

Specifically, after the voltage of the battery is regularly collected at the preset time interval, and the collected voltage and the collection time of the voltage are associatively stored as the voltage data, a preset first derivative relationship is obtained according to each set of voltages in the voltage data and the corresponding collection time. Since each collected voltage has a corresponding first derivative relationship value, the time-differential voltage curve is determined.

The second lithium plating detection result is obtained according to the time-differential voltage curve and a preset peak identification algorithm.

Figure 3:
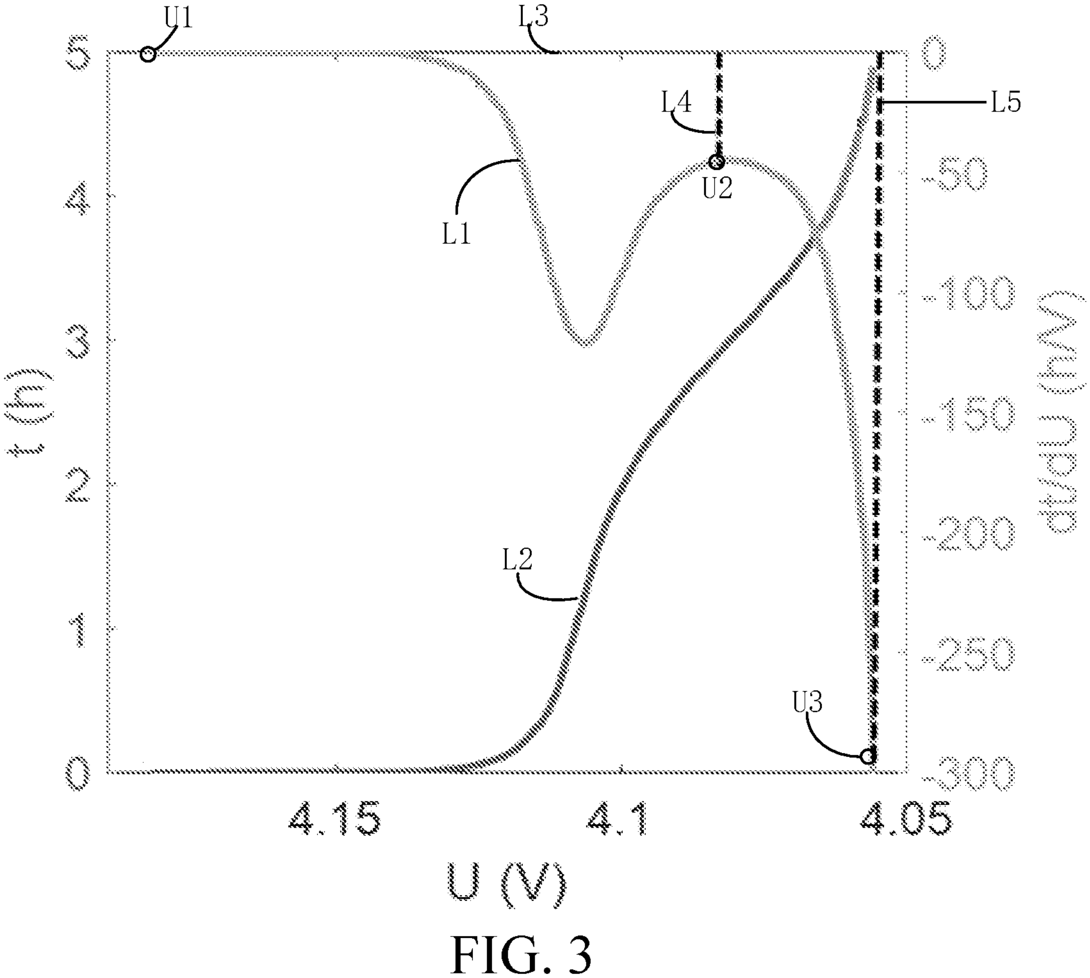
FIG. 3 is a schematic diagram of a voltage-time coordinate system in a battery charging method based on lithium plating detection according to an embodiment of the present disclosure.
Figure 4:
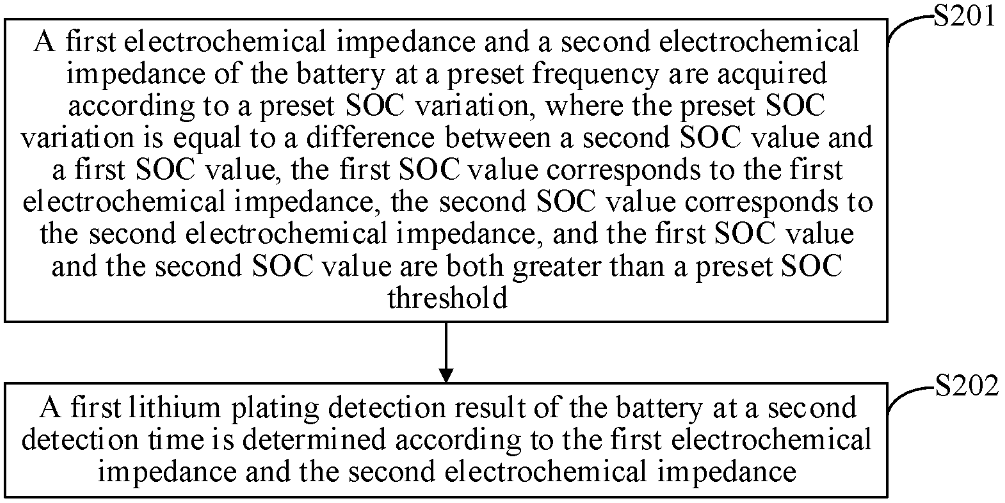
FIG. 4 is a flowchart of step S20 of a battery charging method based on lithium plating detection according to an embodiment of the present disclosure.

The preset peak identification algorithm is used for finding a characteristic peak voltage corresponding to the characteristic peak when the characteristic peak appears in the time-differential voltage curve, and the characteristic peak voltage is used for representing that the lithium plating phenomenon occurs to the battery during charging. In this embodiment, the peak identification algorithm may set a search region in the voltage-time coordinate system (for example, the region may be divided according to time). If the maximum value is found in the region (that is, as shown in FIG. 3, a point where the time-differential voltage curve L1 first rises and then falls indicates that the characteristic peak phenomenon occurs), the point corresponding to the maximum value is determined as the characteristic peak point.

Specifically, after the time-differential voltage curve is constructed in the voltage-time coordinate system according to the voltage data, it is found out whether a characteristic peak voltage exists in the time-differential voltage curve through a preset peak identification algorithm. If the characteristic peak voltage is found in the time-differential voltage curve, it indicates that the second lithium plating detection result is that the lithium plating phenomenon occurs to the battery after the charging is completed. If the characteristic peak voltage is not found in the time-differential voltage curve, it indicates that the second lithium plating detection result is that the lithium plating phenomenon does not occur to the battery after the charging is completed.

S60: When the second lithium plating detection result is that the lithium plating phenomenon occurs, the charging current in the battery charging strategy table is updated according to a preset second current reduction strategy.

The second current reduction strategy means that the reduction proportion of the charging current that needs to be reduced is determined according to the lithium plating representation amount after the charging of the battery is completed and the lithium plating standard corresponding to the battery, and then the charging current in the battery charging strategy table is updated and reduced according to the reduction proportion. For example, the reduction proportion is 1% of the present charging current. In this way, when the charging current in the battery charging strategy table is 1 A, the charging current may be lowered by 1%. That is to say, the charging current is reduced to 0.99 A. It may be understood that in the present disclosure, the preset proportion of the first current reduction strategy and the reduction proportion in the second current reduction strategy may or may not be the same.

Specifically, after the lithium plating detection is performed on the battery to obtain the second lithium plating detection result, the lithium plating representation amount of the battery is further confirmed when the second lithium plating detection result is that a lithium plating phenomenon occurs, to obtain the lithium plating representation amount corresponding to the lithium plating phenomenon after the charging of the battery is completed. The charging current in the battery charging strategy table is then updated according to the lithium plating representation amount and the preset second current reduction strategy.

Optionally, step S60 of updating the charging current in the battery charging strategy table according to the preset second current reduction strategy when the second lithium plating detection result is that the lithium plating phenomenon occurs includes the following steps:

identifying a characteristic peak voltage in the time-differential voltage curve through the preset peak identification algorithm, and recording a corresponding stable voltage when the time-differential voltage curve reaches a preset stability standard after determining the characteristic peak voltage.

The preset stability standard means that the curve value of the time-differential voltage curve satisfies the following requirements of being in the range of −100 to −∞ and approaching a stable state. In this embodiment, when the variation of the time-differential voltage curve with the voltage is particularly small within a long time (the curve approaches a straight line, and the curve value of the time-differential voltage curve approaches a stable state at this time), a corresponding voltage value in the time-differential voltage curve at the beginning of the state is recorded as a stable voltage.

Specifically, after the time-differential voltage curve is determined according to the voltage data, the characteristic peak voltage in the time-differential voltage curve is identified through the peak identification algorithm, which indicates that the lithium plating phenomenon occurs in the charging process of the battery, that is, it is determined that the battery has a lithium plating state in the charging process. In this case, it is necessary to record the corresponding stable voltage when the time-differential voltage curve reaches the preset stability standard after the characteristic peak voltage is determined.

A first region area and a second region area are determined in the voltage-time coordinate system according to the characteristic peak voltage, the stable voltage, and the time-differential voltage curve.

Specifically, after the characteristic peak voltage in the time-differential voltage curve is identified through the peak identification algorithm, and the corresponding stable voltage when the time-differential voltage curve reaches the preset stability standard is recorded after the characteristic peak voltage occurs, a charging voltage at the end of charging the battery is acquired. A starting point of the time-differential voltage curve corresponds to the charging voltage. A horizontal reference axis and a first vertical reference axis are determined. The horizontal reference axis is the horizontal axis corresponding to the starting point in the voltage-time coordinate system, and the first vertical reference axis is the vertical axis corresponding to the characteristic peak voltage in the voltage-time coordinate system. A first region area corresponding to a region jointly defined by the horizontal reference axis, the first vertical reference axis, and the time-differential voltage curve is calculated. In the voltage-time coordinate system shown in FIG. 3, U1 is the starting point corresponding to the charging voltage in the time-differential voltage curve, U2 is the point corresponding to the characteristic peak voltage in the time-differential voltage curve, U3 is the point corresponding to the stable voltage in the time-differential voltage curve, L3 is the horizontal reference axis, L4 is the first vertical reference axis, and L5 is the second vertical reference axis.

The second vertical reference axis is determined. The second vertical reference axis is the vertical axis corresponding to the stable voltage in the voltage-time coordinate system. A second region area corresponding to a region jointly defined by the horizontal reference axis, the first vertical reference axis, the second vertical reference axis, and the time-differential voltage curve is calculated.

The lithium plating representation amount of the battery is determined according to the first region area and the second region area. The charging current in the battery charging strategy table is updated according to the lithium plating representation amount and a preset battery lithium plating standard.

The lithium plating representation amount represents the degree of lithium plating of the battery during charging. The preset battery lithium plating standard is the lithium plating standard obtained by detecting the batteries before leaving the factory, that is, each battery has a corresponding preset battery lithium plating standard.

Specifically, after the first region area is obtained according to the characteristic peak voltage and the time-differential voltage curve, and the second region area is obtained according to the characteristic peak voltage, the stable voltage, and the time-differential voltage curve, the lithium plating representation amount of the battery is determined according to the first region area and the second region area. Then the severity of lithium plating occurring to the battery during the charging at this time may be determined according to the lithium plating standard of the battery in the factory specification (that is, the preset battery lithium plating standard). If the lithium plating representation amount exceeds the corresponding lithium plating standard of the battery, the second current reduction strategy should be adopted to reduce the present charging current in the battery charging strategy table. That is to say, the reduction proportion of the charging current that needs to be reduced is determined according to the difference between the lithium plating representation amount after the battery charging and the lithium plating standard, and then the charging current in the battery charging strategy table is updated and reduced according to the reduction proportion. For example, the lithium plating representation amount after the battery charging exceeds the lithium plating standard, and the reduction proportion is preset to 1% of the present charging current. If the charging current in the battery charging strategy table is 1 A, in this case, the charging current may be lowered by 1%, that is, the charging current may be reduced to 0.99 A. In this way, the battery may be charged by using the lowered charging current in the next charging, thereby reducing the lithium plating representation amount of the battery and further achieving the effect of protecting the battery. It may be understood that if the lithium plating representation amount seriously exceeds the corresponding lithium plating standard of the battery (for example, the excess amount is greater than or equal to a preset percentage of the lithium plating standard), for example, the preset percentage may be 40%. However, the preset percentage may also be set to other percentages besides 40% according to the requirements. It may be understood that when the excess amount is less than the preset percentage, the present charging current in the battery charging strategy table can be reduced according to the second current reduction strategy, which indicates that the battery should be returned to the factory for maintenance to avoid occurrence of safety accidents caused by the excessive lithium plating representation amount of the battery.

It should be noted that the time point when the characteristic peak voltage appears in the time-differential voltage curve is a time point when active lithium is completely intercalated in graphite. That is to say, the physical meaning of the first region area means a duration required for the "active lithium" deposited during charging of the battery to be intercalated from the outside of graphite into the inside. However, the second region area corresponding to the characteristic peak voltage to the stable voltage indicates that the lithium ion concentration is basically balanced from the diaphragm to the copper foil. Therefore, lithium ions tend to diffuse from the outside of the graphite particles to the inside of the particles, so that the lithium ions in the whole graphite particles are evenly distributed.

Specifically, the physical meaning of the first region area means a duration required for the "active lithium" deposited during charging of the battery to be intercalated from the outside of graphite into the inside. It is not accurate to represent the total lithium plating representation amount of the battery only by using the first region area, because the duration is related to the lithium plating representation amount and the lithium intercalation rate of graphite, and the lithium intercalation rate of graphite is also related to the temperature. Therefore, the duration may be used for representing the lithium plating representation amount under the same temperature.

Therefore, the present disclosure uses the reciprocal of the second region area to represent the lithium plating rate of the battery. However, within the collection time of the first region area, part of the "active lithium" that has entered the negative electrode has started to be in equilibrium during the intercalation of other "active lithium" into the negative electrode. Therefore, the time when part of the "active lithium" is in equilibrium in the negative electrode coincides with the collection time of the first region area. However, before the characteristic peak voltage is reached, "active lithium" mainly enters the negative electrode, and after the characteristic peak voltage is reached, the concentration difference of lithium ions in graphite particles in the negative electrode is a rate of lithium intercalation in the graphite (that is, the lithium plating rate) represented by a reciprocal of a time from complete intercalation of all the "active lithium" in the negative electrode to final equilibrium reached by graphite particles in the negative electrode (that is, the second region area).

It is pointed out according to the above description that the first region area may be recorded as the lithium plating duration of the battery, and the reciprocal of the second region area is recorded as the lithium plating rate of the battery. Further, the product of the reciprocal of the second region area and the first region area is recorded as the lithium plating representation amount of the battery, that is, the product of the lithium plating duration and the lithium plating rate is recorded as the lithium plating representation amount of the battery.

In another specific embodiment, after the lithium plating detection is performed on the battery to obtain the second lithium plating detection result, the method further includes the following.

When the second lithium plating detection result is that no lithium plating phenomenon occurs, that is, after the charging of the battery is completed, no lithium plating phenomenon occurs, it indicates that in the next charging process of the battery, the battery is charged by using the present charging current in the battery charging strategy table without increasing the lithium plating representation amount of the battery, and the charging current in the battery charging strategy table is not updated. Optionally, when the characteristic peak voltage in the time-differential voltage curve is not identified through the peak identification algorithm, it is prompted that no lithium plating phenomenon occurs to the battery during charging. Specifically, since the characteristic peak voltage is used for representing the occurrence of lithium plating of the battery in the charging process in a physical sense in the present disclosure, after the time-differential voltage curve is determined according to the voltage data, it indicates that no lithium plating phenomenon occurs to the battery during charging when the characteristic peak voltage in the time-differential voltage curve is not identified through the peak identification algorithm.

In this embodiment, after the charging of the battery is completed, the battery is allowed to stand for lithium plating detection, to determine whether the lithium plating phenomenon occurs to the battery after being charged, and when the lithium plating phenomenon occurs to the battery, the present charging current of the battery is reduced according to the preset second current reduction strategy, so as to improve the safety of the battery in the charging process. In addition, it is ensured that the battery is charged by using the updated charging current in the battery charging strategy table when receiving the charging instruction next time, so as to avoid the lithium plating phenomenon and further improve the safety of the battery.

In an embodiment, as shown in FIG. 3, step S20 of performing at least one charging lithium plating detection on the battery during the charging of the battery to obtain the first lithium plating detection result includes the following steps.

S201: A first electrochemical impedance and a second electrochemical impedance of the battery at a preset frequency are acquired according to a preset SOC variation, where the preset SOC variation is equal to a difference between a second SOC value and a first SOC value, the first SOC value corresponds to the first electrochemical impedance, the second SOC value corresponds to the second electrochemical impedance, and the first SOC value and the second SOC value are both greater than a preset SOC threshold.

In one charging lithium plating detection, the first SOC value is a ratio of a current remaining capacity of the battery before the charging lithium plating detection to a capacity of the battery in a fully charged state, and the second SOC value is a ratio of the current remaining capacity of the battery after the charging lithium plating detection to the capacity of the battery in a fully charged state. Optionally, the preset SOC threshold may be determined according to the type of the battery and the charging requirement. For example, the preset SOC threshold may be 70%, 75%, and the like. An electrochemical impedance is a ratio of an AC voltage to a current signal of the battery during charging, and the electrochemical impedance corresponds to the SOC value and the preset frequency of the battery (for example, the first electrochemical impedance corresponds to the first SOC value and the preset frequency, and the second electrochemical impedance corresponds to the second SOC value and the preset frequency). For example, a preset frequency may be any value selected from a frequency range of 0.01 Hz to 10 Hz. The preset frequency may be determined according to the type of the battery, that is, different types of batteries (such as a power battery and a 3C battery) correspond to different preset frequencies.

Optionally, the preset SOC variation may be set according to requirements, for example, set to 5%, 10%, and the like. Assuming that the preset SOC variation is 5% and the preset SOC threshold is 70%, the first SOC value may be 75% and the second SOC value may be 80%.

Specifically, in this embodiment, the electrochemical impedance measurement method is used for performing charging lithium plating detection on the battery. After the battery is charged according to the charging current in the battery charging strategy table, the first electrochemical impedance and the second electrochemical impedance of the battery at the preset frequency are acquired according to the preset SOC variation.

In a specific implementation, it is assumed that only one charging lithium plating detection is performed on the battery during charging, and the first lithium plating detection result is that the lithium plating phenomenon occurs to the battery during charging, and only one set of corresponding first electrochemical impedance and second electrochemical impedance exist in this charging lithium plating detection. That is to say, the first lithium plating detection result determined according to the set of first electrochemical impedance and second electrochemical impedance is that the lithium plating phenomenon occurs to the battery during charging.

In another specific implementation, it is assumed that multiple charging lithium plating detections are performed on the battery during charging, and the last lithium plating detection result is that the lithium plating phenomenon occurs to the battery during charging. In this case, multiple sets of corresponding first electrochemical impedance and second electrochemical impedance exist in the charging lithium plating detection. When the first lithium plating detection result is that no lithium plating phenomenon occurs to the battery charging process, the second electrochemical impedance at this time may be used as a new first electrochemical impedance for the next charging lithium plating detection, a new second electrochemical impedance corresponding to the new first electrochemical impedance is obtained according to the preset SOC variation, and a new first lithium plating detection result is determined according to the new first electrochemical impedance and the new second electrochemical impedance. A difference between the second SOC value and the first SOC value in each set that correspond to each other is equal to the preset SOC variation.

S202: The first lithium plating detection result of the battery at a second detection time is determined according to the first electrochemical impedance and the second electrochemical impedance.

Specifically, After the second electrochemical impedance of the battery at a preset frequency at the second detection time is acquired, the first electrochemical impedance is compared with the second electrochemical impedance, and then the first lithium plating detection result of the battery at the second detection time is determined according to the result obtained after comparison.

After the first electrochemical impedance is compared with the second electrochemical impedance, it is determined that the first lithium plating detection result at the second detection time is that the lithium plating phenomenon occurs when the first electrochemical impedance is greater than the second electrochemical impedance.

After the first electrochemical impedance is compared with the second electrochemical impedance, it is determined that the first lithium plating detection result at the second detection time is that no lithium plating phenomenon occurs when the first electrochemical impedance is less than or equal to the second electrochemical impedance.

It should be understood that the sequence number of steps in the above embodiments does not mean the order of execution, and the order of execution of each process should be determined by its function and internal logic, and should not constitute any limitation on the implementation process of the embodiments of the present disclosure.

Figure 5:
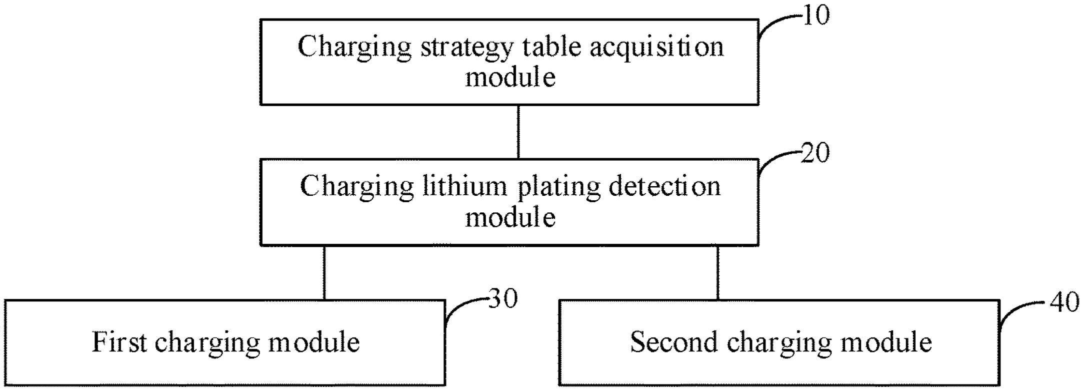
FIG. 5 is a schematic block diagram of a battery charging system based on lithium plating detection according to an embodiment of the present disclosure.

In an embodiment, as shown in FIG. 5, a battery charging system based on lithium plating detection is provided, including the following modules:

- a charging strategy table acquisition module 10, configured to acquire a battery charging strategy table after receiving a battery charging instruction;
- a charging lithium plating detection module 20, configured to: charge a battery according to a charging current in the battery charging strategy table, and perform at least one charging lithium plating detection on the battery during the charging of the battery, to obtain a first lithium plating detection result;
- a first charging module 30, configured to: continue the charging of the battery according to the charging current and the charging lithium plating detection of the battery during the charging of the battery, when the first lithium plating detection result is that no lithium plating phenomenon occurs, and stop the charging lithium plating detection of the battery when the first lithium plating detection result is that a lithium plating phenomenon occurs or the charging of the battery is completed; and
- a second charging module 40, configured to update the charging current in the battery charging strategy table according to a preset first current reduction strategy when the first lithium plating detection result is that the lithium plating phenomenon occurs, and continue the charging of the battery according to the updated charging current until the charging of the battery is completed.

Figure 6:
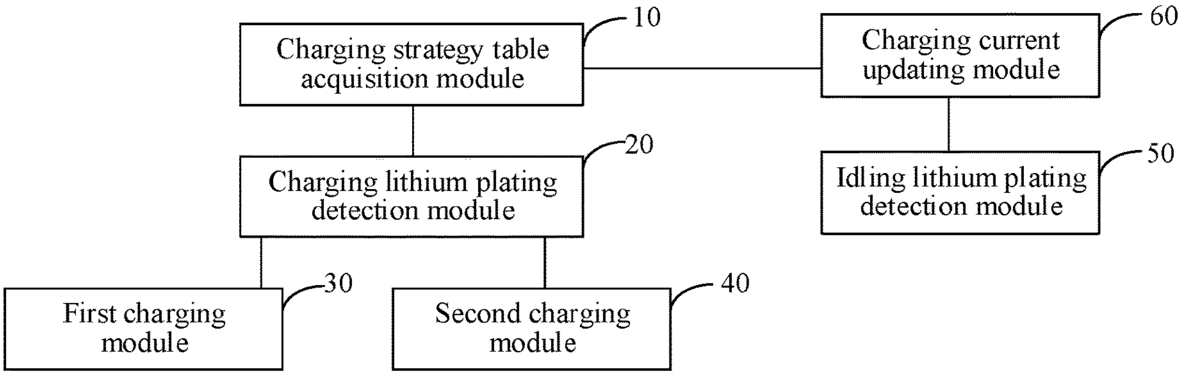
FIG. 6 is another schematic block diagram of a battery charging system based on lithium plating detection according to an embodiment of the present disclosure.

Optionally, as shown in FIG. 6, the battery charging system based on lithium plating detection further includes the following modules:

- an lithium plating detection module 50, configured to perform lithium plating detection on the battery after the charging of the battery is completed and the battery is in an static state, to obtain a second lithium plating detection result; and
- a charging current updating module 60, configured to update the charging current in the battery charging strategy table according to a preset second current reduction strategy when the second lithium plating detection result is that the lithium plating phenomenon occurs.

Optionally, the lithium plating detection module 50 includes the following units:

- a voltage collection unit, configured to regularly collect a voltage of the battery at a preset time interval and associatively store the collected voltage and a collection time of the voltage as voltage data after the charging of the battery is completed and the battery is in the static state;
- a curve construction unit, configured to construct a time-differential voltage curve in a voltage-time coordinate system according to the voltage data; and
- a peak identification unit, configured to obtain the second lithium plating detection result according to the time-differential voltage curve and a preset peak identification algorithm.

Optionally, the charging current updating module 60 includes the following units:

a voltage recording unit, configured to identify a characteristic peak voltage in the time-differential voltage curve through the preset peak identification algorithm, and record a corresponding stable voltage when the time-differential voltage curve reaches a preset stability standard after determining the characteristic peak voltage;

an area determining unit, configured to determine a first region area and a second region area in the voltage-time coordinate system according to the characteristic peak voltage, the stable voltage, and the time-differential voltage curve;

a lithium plating representation amount determining unit, configured to determine a lithium plating representation amount of the battery according to the first region area and the second region area; and a current updating unit, configured to update the charging current in the battery charging strategy table according to the lithium plating representation amount and a preset battery lithium plating standard.

Optionally, the charging lithium plating detection module 20 includes the following units:

an electrochemical impedance acquisition unit, configured to acquire the first electrochemical impedance and the second electrochemical impedance of the battery at the preset frequency according to the preset SOC variation, where the first SOC value corresponding to the first electrochemical impedance and the second SOC value corresponding to the second electrochemical impedance are both greater than the preset SOC threshold, and a difference between the second SOC value and the first SOC value is equal to the preset SOC variation; and a lithium plating detection result acquisition unit, configured to acquire the first lithium plating detection result according to the first electrochemical impedance and the second electrochemical impedance.

Optionally, the lithium plating detection result acquisition unit includes the following subunits:

a first impedance comparison unit, configured to determine that the first lithium plating detection result is that the lithium plating phenomenon occurs when the first electrochemical impedance is greater than the second electrochemical impedance; and a second impedance comparison unit, configured to determine that the first lithium plating detection result is that no lithium plating phenomenon occurs when the first electrochemical impedance is less than or equal to the second electrochemical impedance.

In an embodiment, a vehicle is provided, including the battery charging system based on lithium plating detection.

Figure 7:
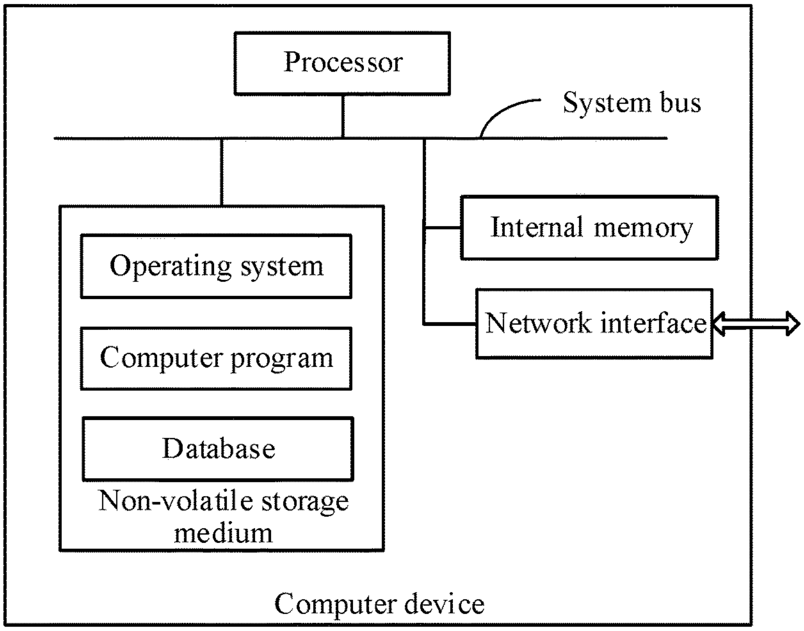
FIG. 7 is a schematic diagram of a computer device according to an embodiment of the present disclosure.

In an embodiment, a computer device is provided. The computer device may be a server. An internal structure diagram of the server may be shown in FIG. 7. The computer device includes a processor, a memory, a network interface, and a database connected through a system bus. The processor of the computer device is configured to provide computing and control capabilities. The memory of the computer device includes a non-volatile storage medium and an internal memory. The non-volatile storage medium stores an operating system, a computer program, and a database. The internal memory provides an environment for the running of the operating system and the computer program in the non-volatile storage medium. The network interface of the computer device is configured to communicate with an external terminal through network connection. When the computer program is executed by a processor, the battery charging method based on lithium plating detection is implemented.

In an embodiment, a computer device is provided, including a memory, a processor, and a computer program stored on the memory and executable by the processor. When the computer program is executed by the processor, the battery charging method based on lithium plating detection in the above embodiment is implemented.

In an embodiment, a computer-readable storage medium is provided, storing a computer program, the computer program, when executed by a processor, implementing the battery charging method based on lithium plating detection in the embodiment.

A person of ordinary skill in the art may understand that all or some of process of the method in the foregoing embodiments may be implemented by using a computer program to instruct relevant hardware. The computer program may be stored in a non-volatile computer-readable storage medium. When the computer program is executed, the process of the foregoing method embodiments may be included. Any reference to the memory, storage, the database, or other media used in the embodiments provided in the present disclosure may include a non-volatile memory or a volatile memory. The non-volatile memory may include a read-only memory (ROM), a programmable ROM (PROM), an electrically programmable ROM (EPROM), an electrically erasable programmable ROM (EEPROM), or a flash memory. The volatile memory may include a RAM or an external cache memory. By way of description rather than limitation, the RAM may be obtained in multiple forms, such as a static RAM (SRAM), a dynamic RAM (DRAM), a synchronous DRAM (SDRAM), a double data rate SDRAM (DDRSDRAM), an enhanced SDRAM (ESDRAM), a Synchlink DRAM (SLDRAM), a Rambus Direct RAM (RDRAM), a Direct Rambus Dynamic RAM (DRDRAM), and a Rambus Dynamic RAM (RDRAM).

It can be clearly understood by those skilled in the art that for the convenience and conciseness of description, only the division of the above functional units and modules is used as an example for description. In practical application, the above functional allocation may be completed by different functional units and modules as required, that is, the internal structure of the device is divided into different functional units or modules to complete all or part of the functions described above.

The foregoing embodiments are merely intended to describe the technical solutions of the present disclosure, rather than limiting the present disclosure. Although the present disclosure is described in detail with reference to the foregoing embodiments, a person of ordinary skill in the art should understand that the technical solutions described in the foregoing embodiments may still be modified, or some technical features mat be replaced by equivalents. However, these modifications or substitutions do not make the essence of the corresponding technical solutions depart from the spirit and scope of the technical solutions of various embodiments of the present disclosure, and shall fall within the protection scope of the present disclosure.

What is claimed is:

1. A battery charging method based on lithium plating detection, comprising:

acquiring a battery charging strategy table after receiving a battery charging instruction, wherein the battery charging strategy table is created based on a fast charging strategy formulated by a factory when the battery leaves the factory; the battery charging strategy table contains data related to battery charging including a charging current and a charging voltage; and the charging current in the battery charging strategy table is updated and adjusted depending on whether a lithium plating phenomenon occurs to the battery during charging and upon completion of charging of the battery;

charging the battery according to the charging current in the battery charging strategy table, and performing at least one charging lithium plating detection on the battery during the charging of the battery, to obtain a first lithium plating detection result;

continuing the charging of the battery according to the charging current and the charging lithium plating detection of the battery during the charging of the battery when the first lithium plating detection result is that no lithium plating phenomenon occurs, and stopping the charging lithium plating detection of the battery when the first lithium plating detection result is that the lithium plating phenomenon occurs or the charging of the battery is completed; and updating the charging current in the battery charging strategy table according to a preset first current reduction strategy when the first lithium plating detection result is that the lithium plating phenomenon occurs, and continuing the charging of the battery according to the updated charging current until the charging of the battery is completed.

2. The battery charging method according to claim 1, wherein after the charging of the battery is completed, the method comprises:

performing lithium plating detection on the battery after the charging of the battery is completed and the battery is in an static state, to obtain a second lithium plating detection result; and updating the charging current in the battery charging strategy table according to a preset second current reduction strategy when the second lithium plating detection result is that the lithium plating phenomenon occurs.

3. The battery charging method according to claim 2, wherein the performing lithium plating detection on the battery after the charging of the battery is completed and the battery is in an static state, to obtain a second lithium plating detection result comprises:

regularly collecting a voltage of the battery at a preset time interval after the charging of the battery is completed and the battery is in an static state, and associatively storing the collected voltage and a collection time of the voltage as voltage data;

constructing a time-differential voltage curve in a voltage-time coordinate system according to the voltage data; and obtaining the second lithium plating detection result according to the time-differential voltage curve and a preset peak identification algorithm.

4. The battery charging method according to claim 3, wherein the updating the charging current in the battery charging strategy table according to a preset second current reduction strategy comprising:

identifying a characteristic peak voltage in the time-differential voltage curve through the preset peak identification algorithm, and recording a corresponding stable voltage when the time-differential voltage curve reaches a preset stability standard after determining the characteristic peak voltage;

determining a first region area and a second region area in the voltage-time coordinate system according to the characteristic peak voltage, the stable voltage, and the time-differential voltage curve;

determining a lithium plating representation amount of the battery according to the first region area and the second region area; and updating the charging current in the battery charging strategy table according to the lithium plating representation amount and a preset battery lithium plating standard.

5. The battery charging method according to claim 1, wherein the performing at least one charging lithium plating detection on the battery during the charging of the battery, to obtain a first lithium plating detection result comprises:

acquiring a first electrochemical impedance and a second electrochemical impedance of the battery at a preset frequency according to a preset SOC variation, wherein the preset SOC variation is equal to a difference between a second SOC value and a first SOC value; the first SOC value corresponds to the first electrochemical impedance; the second SOC value corresponds to the second electrochemical impedance; and the first SOC value and the second SOC value are both greater than a preset SOC threshold; and acquiring the first lithium plating detection result according to the first electrochemical impedance and the second electrochemical impedance.

6. The battery charging method according to claim 5, wherein the acquiring the first lithium plating detection result of the battery according to the first electrochemical impedance and the second electrochemical impedance comprises:

determining that the first lithium plating detection result is that the lithium plating phenomenon occurs when the first electrochemical impedance is greater than the second electrochemical impedance; and determining that the first lithium plating detection result is that no lithium plating phenomenon occurs when the first electrochemical impedance is less than or equal to the second electrochemical impedance.

7. A battery charging system based on lithium plating detection, comprising:

a charging strategy table acquisition module, configured to acquire a battery charging strategy table after receiving a battery charging instruction, wherein the battery charging strategy table is created based on a fast charging strategy formulated by a factory when the battery leaves the factory; the battery charging strategy table contains data related to battery charging including a charging current and a charging voltage; and the charging current in the battery charging strategy table is updated and adjusted depending on whether a lithium plating phenomenon occurs to the battery during charging and upon completion of charging of the battery;

a charging lithium plating detection module, configured to charge the battery according to the charging current in the battery charging strategy table, and perform at least one charging lithium plating detection on the battery during the charging of the battery, to obtain a first lithium plating detection result;

a first charging module, configured to: continue the charging of the battery according to the charging current and the charging lithium plating detection of the battery during the charging of the battery when the first lithium plating detection result is that no lithium plating phenomenon occurs, and stop the charging lithium plating detection of the battery when the first lithium plating detection result is that the lithium plating phenomenon occurs or the charging of the battery is completed; and a second charging module, configured to update the charging current in the battery charging strategy table according to a preset first current reduction strategy when the first lithium plating detection result is that the lithium plating phenomenon occurs, and continue the charging of the battery according to the updated charging current until the charging of the battery is completed.

8. The battery charging system according to claim 7, further comprising:

an lithium plating detection module, configured to perform lithium plating detection on the battery after the charging of the battery is completed and the battery is in an static state, to obtain a second lithium plating detection result; and a charging current updating module, configured to update the charging current in the battery charging strategy table according to a preset second current reduction strategy when the second lithium plating detection result is that the lithium plating phenomenon occurs.

9. A vehicle, comprising the battery charging system based on lithium plating detection according to claim 7.

10. A non-transitory computer-readable storage medium storing computer-executable instructions for, when executed by one or more processors, performing a battery charging method based on lithium plating detection, the method comprising:

acquiring a battery charging strategy table after receiving a battery charging instruction, wherein the battery charging strategy table is created based on a fast charging strategy formulated by a factory when the battery leaves the factory; the battery charging strategy table contains data related to battery charging including a charging current and a charging voltage; and the charging current in the battery charging strategy table is updated and adjusted depending on whether a lithium plating phenomenon occurs to the battery during charging and upon completion of charging of the battery;

charging the battery according to the charging current in the battery charging strategy table, and performing at least one charging lithium plating detection on the battery during the charging of the battery, to obtain a first lithium plating detection result;

continuing the charging of the battery according to the charging current and the charging lithium plating detection of the battery during the charging of the battery when the first lithium plating detection result is that no lithium plating phenomenon occurs, and stopping the charging lithium plating detection of the battery when the first lithium plating detection result is that the lithium plating phenomenon occurs or the charging of the battery is completed; and updating the charging current in the battery charging strategy table according to a preset first current reduction strategy when the first lithium plating detection result is that the lithium plating phenomenon occurs, and continuing the charging of the battery according to the updated charging current until the charging of the battery is completed.

11. The non-transitory computer-readable storage medium according to claim 10, wherein after the charging of the battery is completed, the method comprises:

performing lithium plating detection on the battery after the charging of the battery is completed and the battery is in an static state, to obtain a second lithium plating detection result; and updating the charging current in the battery charging strategy table according to a preset second current reduction strategy when the second lithium plating detection result is that the lithium plating phenomenon occurs.

12. The non-transitory computer-readable storage medium according to claim 11, wherein the performing lithium plating detection on the battery after the charging of the battery is completed and the battery is in an static state, to obtain a second lithium plating detection result comprises:

regularly collecting a voltage of the battery at a preset time interval after the charging of the battery is completed and the battery is in an static state, and associatively storing the collected voltage and a collection time of the voltage as voltage data;

constructing a time-differential voltage curve in a voltage-time coordinate system according to the voltage data; and obtaining the second lithium plating detection result according to the time-differential voltage curve and a preset peak identification algorithm.

13. The non-transitory computer-readable storage medium according to claim 12, wherein the updating the charging current in the battery charging strategy table according to a preset second current reduction strategy comprising:

identifying a characteristic peak voltage in the time-differential voltage curve through the preset peak identification algorithm, and recording a corresponding stable voltage when the time-differential voltage curve reaches a preset stability standard after determining the characteristic peak voltage;

determining a first region area and a second region area in the voltage-time coordinate system according to the characteristic peak voltage, the stable voltage, and the time-differential voltage curve;

determining a lithium plating representation amount of the battery according to the first region area and the second region area; and updating the charging current in the battery charging strategy table according to the lithium plating representation amount and a preset battery lithium plating standard.

14. The non-transitory computer-readable storage medium according to claim 10, wherein the performing at least one charging lithium plating detection on the battery during the charging of the battery, to obtain a first lithium plating detection result comprises:

acquiring a first electrochemical impedance and a second electrochemical impedance of the battery at a preset frequency according to a preset SOC variation, wherein the preset SOC variation is equal to a difference between a second SOC value and a first SOC value; the first SOC value corresponds to the first electrochemical impedance; the second SOC value corresponds to the second electrochemical impedance; and the first SOC value and the second SOC value are both greater than a preset SOC threshold; and acquiring the first lithium plating detection result according to the first electrochemical impedance and the second electrochemical impedance.

15. The non-transitory computer-readable storage medium according to claim 14, wherein the acquiring the first lithium plating detection result of the battery according to the first electrochemical impedance and the second electrochemical impedance comprises:

determining that the first lithium plating detection result is that the lithium plating phenomenon occurs when the first electrochemical impedance is greater than the second electrochemical impedance; and determining that the first lithium plating detection result is that no lithium plating phenomenon occurs when the first electrochemical impedance is less than or equal to the second electrochemical impedance.

* * * * *